United States Patent
Knoblinger

(10) Patent No.: US 8,492,796 B2
(45) Date of Patent: Jul. 23, 2013

(54) MUGFET SWITCH

(75) Inventor: Gerhard Knoblinger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 733 days.

(21) Appl. No.: 11/685,346

(22) Filed: Mar. 13, 2007

(65) Prior Publication Data

US 2008/0224217 A1    Sep. 18, 2008

(51) Int. Cl.
*H01L 27/118*  (2006.01)
*H01L 27/148*  (2006.01)

(52) U.S. Cl.
USPC .......... 257/204; 257/241; 257/369; 257/350; 257/E27.046; 257/E21.014

(58) Field of Classification Search
USPC .................. 327/291, 434; 257/347, E29.028, 257/E21.014, E21.637, E21.623, 341, 319, 257/270, 287, 241, 368–369, 331, 366, 314, 257/326, 390, E27.098, E21.661, E27.084, 257/202, 204, 206, 213, 350, 499, E51.005, 257/E27.046, E27.108; 438/479; 365/129

See application file for complete search history.

(56) References Cited

U.S. PATENT DOCUMENTS

| | | | |
|---|---|---|---|
| 6,333,642 B1 * | 12/2001 | Kurisu | 326/73 |
| 6,413,802 B1 * | 7/2002 | Hu et al. | 438/151 |
| 6,765,303 B1 | 7/2004 | Krivokapic et al. | |
| 7,170,772 B1 * | 1/2007 | Buyuktosunoglu et al. | 365/129 |
| 7,709,303 B2 * | 5/2010 | Burnett et al. | 438/149 |
| 2001/0040479 A1 | 11/2001 | Zhang | |
| 2003/0011410 A1 * | 1/2003 | Koizumi | 327/124 |
| 2003/0193058 A1 * | 10/2003 | Fried et al. | 257/200 |
| 2004/0155281 A1 * | 8/2004 | Osada et al. | 257/315 |
| 2005/0237850 A1 * | 10/2005 | Datta et al. | 365/232 |
| 2005/0242395 A1 * | 11/2005 | Chen et al. | 257/347 |
| 2006/0044038 A1 * | 3/2006 | Okuda | 327/291 |
| 2006/0049865 A1 * | 3/2006 | Keskin | 327/536 |
| 2006/0084212 A1 * | 4/2006 | Anderson et al. | 438/197 |
| 2006/0255410 A1 | 11/2006 | Bernstein et al. | |

FOREIGN PATENT DOCUMENTS

| | | |
|---|---|---|
| JP | 2000101032 | 4/2000 |
| JP | 2009223799 | 10/2009 |
| KR | 20050086701 | 8/2005 |
| WO | WO-2004049445 A1 | 6/2004 |

OTHER PUBLICATIONS

"German Application Serial No. 102008012987.9, Office Action mailed Aug. 19, 2009", 5 pgs.

"Korean Application Serial No. 2008-0023241 Office Action Mailed Dec. 11, 2009", 6 pgs.

"Korean Application Serial No. 2008-0023241, Notice of Allowance mailed Jun. 30, 2010", 2 Pgs.

"Korean Application Serial No. 2008-0023241, Response filed Feb. 11, 2010 to Office Action mailed Dec. 11, 2009", with English translation of claims, 18 pgs.

* cited by examiner

*Primary Examiner* — Lynne Gurley
*Assistant Examiner* — Galina Yushina
(74) *Attorney, Agent, or Firm* — Schwegman, Lundberg & Woessner, P.A.

(57) ABSTRACT

An electronic circuit on a semiconductor substrate having isolated multiple field effect transistor circuit blocks is disclosed. In some embodiment, an apparatus includes a substrate, a first semiconductor circuit formed above the substrate, a second semiconductor circuit formed above the substrate, and a MuGFET device overlying the substrate and electrically coupled to the first semiconductor circuit and the second semiconductor circuit, wherein the MuGFET device provides a signal path between the first semiconductor circuit and the second semiconductor circuit in response to an input signal.

36 Claims, 4 Drawing Sheets

US 8,492,796 B2

MUGFET SWITCH

TECHNICAL FIELD

Various embodiments described herein relate to semiconductor devices and, more particularly, to field effect transistors.

BACKGROUND

Multi-gate field effect transistor devices are often designed for applications with scaled-down, extremely small devices which operate at low supply voltages. Moreover, multi-gate devices have gates on multiple sides of the conducting channel thereby providing better control of the semiconductor device.

DETAILED DESCRIPTION

Figure 1A:
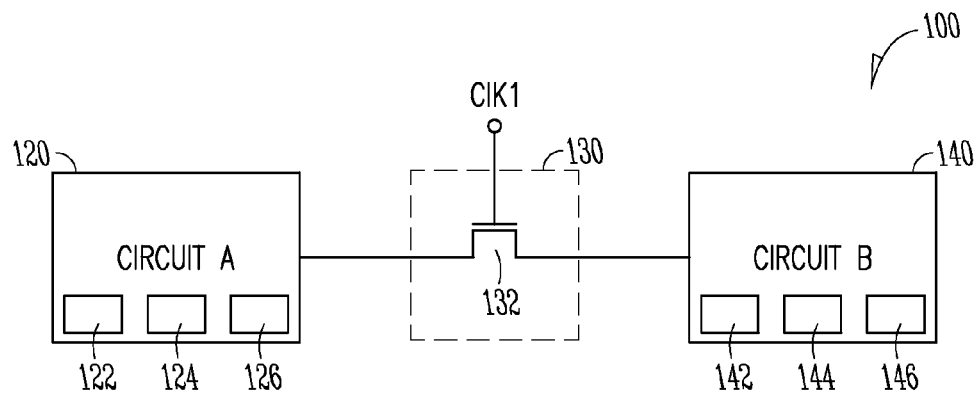
FIG. 1A illustrates a schematic of a semiconductor circuit, according to some embodiments of the invention.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. In this document, the terms "a" or "an" are used, as is common in patent documents, to include one or more than one. In this document, the term "or" is used to refer to nonexclusive or, such that "A or B" includes "A but not B," "B but not A," and "A and B," unless otherwise indicated.

In the following description, the terms "wafer" and "substrate" may be used interchangeably to refer generally to any structure on which integrated circuits are formed and also to such structures during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "multiple gate field effect transistor" (MuGFET) is used interchangeably with FinFET herein for the general class of semiconductor devices having field effect transistors formed above a buried oxide layer of a substrate.

The term "conductor" is understood to generally include n-type and p-type semiconductors and the term "insulator" or "dielectric" is defined to include any material that is less electrically conductive than the materials referred to as "conductors." The following detailed description is, therefore, not to be taken in a limiting sense.

The following disclosure relates in general to providing for operation of structure employing multiple circuit blocks, some of which include MuGFET devices. Multiple MuGFET devices are formed above a buried oxide contact region of a single substrate and supported by the substrate. In general, this is different from planar CMOS devices which have a conducting channel only at the surface of the silicon. Bulk CMOS devices require increased doping levels with increased scaling. This adversely affects carrier mobility and junction capacitance. Additionally, planar devices usually only have a single gate on the surface of the silicon to control the channel on the surface of the semiconductor as opposed to their MuGFET counterparts which can have multiple gates formed around a raised channel. Moreover, the multiple gate configuration provides for greater control of the conducting channel and reduces detrimental performance due to short channel effects. Furthermore, multi-gate semiconductor devices provide better turn-on characteristics and have lower leakage current characteristics compared to planar CMOS devices.

In some embodiments, because the MuGFET devices are electrically insulated from the substrate and each other by being formed above the buried oxide contact region, individual devices can be connected to separate circuits having different sources of reference potential and to separate power supplies. In other example embodiments, other semiconductor devices may also be formed above and supported by the substrate in contact regions thereof which are not insulated by the buried oxide contact region (shown in FIG. 5B). The various circuit blocks can be coupled to each other by a suitable coupling element or coupling network despite their being operatively coupled to different sources of reference potential. In some embodiments the circuit blocks are driven from different power sources.

FIG. 1A illustrates a schematic diagram of a semiconductor circuit 100, according to some embodiments of the invention. In some embodiments, semiconductor circuit 100 includes a circuit 120, a switching circuit 130, and a circuit 140. In some embodiments, circuit 120 comprises a MuGFET device 122 or a CMOS device 124. In some embodiments, circuit 120 includes a voltage source 126. In some embodiments, circuit 140 comprises a MuGFET device 142, a capacitor 144 or a voltage source 146. In some embodiments, switching circuit 130 includes a MuGFET device 132 having a source region and a drain region which are electrically coupled to circuit 120 and circuit 140, respectively. In some embodiments, the gate region of MuGFET device 132 is electrically coupled to a circuit that provides a control signal at port "CLK". In operation, when the gate region of MuGFET 132 is provided with an input signal received through port "CLK", the conducting channel within MuGFET 132 provides a signal path between the first semiconductor circuit and the second semiconductor circuit in response to an input signal. In some embodiments, the input signal received at port "CLK" includes an analog signal that allows for controlling the resistance in the signal path between the first semiconductor circuit and the second semiconductor circuit.

Figure 1B:
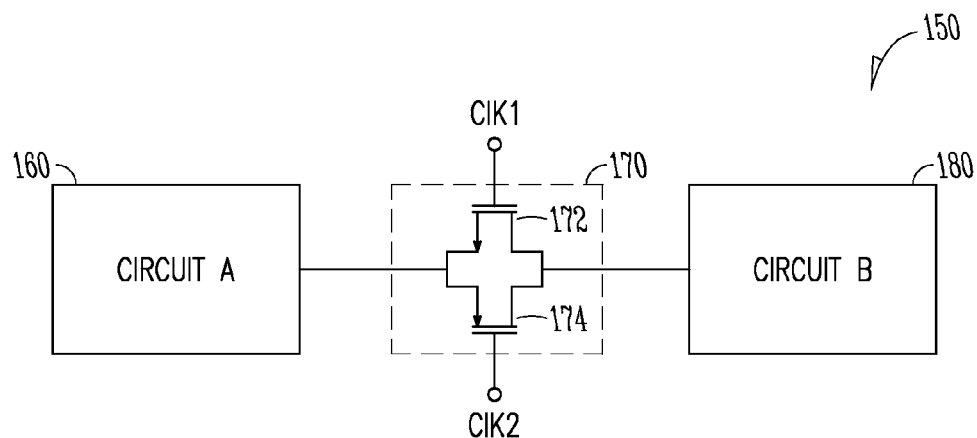
FIG. 1B illustrates a schematic of a semiconductor circuit, according to some embodiments of the invention.

FIG. 1B illustrates a schematic diagram of a semiconductor circuit 150 according to some embodiments of the invention. In some embodiments, semiconductor circuit 150 includes a circuit 160, a switching circuit 170, and a circuit 180. In some embodiments, switching circuit 170 includes a first MuGFET device 172 having an n-type channel and a second MuGFET device 174 having a p-type channel electrically coupled in parallel between the source/drain regions and drain regions of the devices. In some embodiments, MuGFET device 172 has a p-type channel and MuGFET device 174 has an n-type channel. Source/drain regions of MuGFET devices 172, 174 are electrically coupled to circuits 160 and 180.

In some embodiments, the gate region of MuGFET device 172 is electrically coupled to a circuit that provides a control signal at port "CLK1" and the gate region of MuGFET 174 is electrically coupled to another circuit that provides another switching signal at port "CLK2". In operation, when the gate regions of MuGFET devices 172, 174 are provided with input signals received at ports "CLK1", "CLK2", the conducting channel within MuGFET devices 172, 174 provide a signal path between the first semiconductor circuit and the second semiconductor circuit in response to input signals at ports "CLK1", "CLK2". In some embodiments, the input signals received at ports "CLK1" and "CLK2" include analog signals that allow for controlling the resistance in the signal path between the first semiconductor circuit and the second semiconductor circuit.

Figure 2:
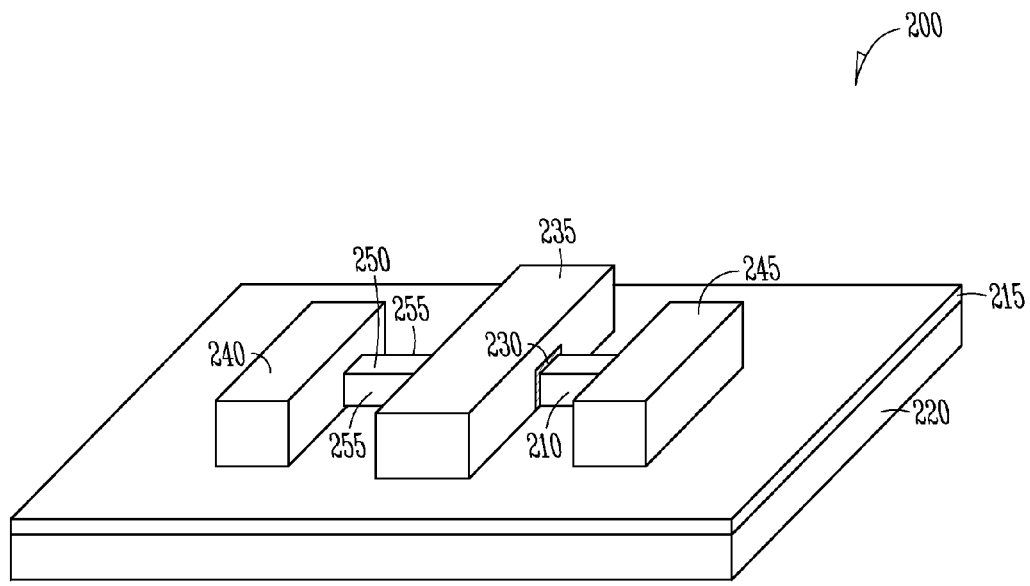
FIG. 2 illustrates a perspective view of a MuGFET device used in the semiconductor circuit shown in FIG. 1, according to some embodiments of the invention.

FIG. 2 illustrates a perspective view of a MuGFET device 200 used in the semiconductor circuit shown in FIG. 1, according to some embodiments of the invention. FIG. 2 shows an example of a multiple gate field effect transistor access device 200 for use in the circuit shown in FIG. 1. Transistor 200 may be a single p-doped or an n-doped fin transistor 200 and has a body 210, also referred to as a fin 210. The fin may be formed on an insulating surface 215 of a substrate 220. In some embodiments, substrate 220 used is preferably mono-crystalline silicon, although it is also possible to use any other desired semiconductor substrates, such as silicon on insulator (SOI), Germanium or other Group III-IV semiconductors. In some embodiments, the insulating surface may be a buried oxide or other insulating layer 215 over a silicon or other semiconductor substrate 220. A gate dielectric structure 230 is formed over the top and on the sides of the semiconductor fin 210. A gate electrode 235 is formed over the top and on the sides of the gate dielectric 230 and may include a metal layer. A source region 240 and a drain region 245 may be formed in the semiconductor fin 210 on either side of the gate electrode, and may be laterally expanded to be significantly larger than the fin 210 under the gate electrode 235 in various embodiments.

The fin 210 has a top surface 250 and laterally opposite sidewalls 255. The fin 210 has a height or thickness equal to T and a width equal to W. The gate width of a single fin MuGFET transistor is equal to the sum of the gate widths of each of the three gates formed on the semiconductor body, or, T+W+T, which provides high gain. In some embodiments, the fin is substantially in the shape of a rectangle. In other embodiments, the fin is substantially in the shape of a rectangle with corners rounded. In an embodiment, the height to width ratio of the fin can be substantially in the range of 3:1 to 5:1. In an embodiment, the width of the fin is substantially 20 nm.

In some embodiments described above, the fin 210 is made of silicon. In some embodiments, the fin 210 can be made of other semiconductor materials, like germanium, silicon carbide, gallium arsenide, as well as indium phosphide. In some embodiments, the fin 210 may be coated with a thin film of silicate, for example, with a thickness of 10 nm approximately. In some embodiments, a plurality of fins may be used as opposed to a single fin 210 shown in FIG. 2. In such configurations the increase in the number of fins allows for increasing the amount of current conducted through the conducting channel (provided by the multiple fins) between the source and drain regions.

Better noise immunity results from forming the transistors on an insulator. Formation on the insulator provides isolation between devices, and hence the better noise immunity. It further alleviates the need for multiple large well areas to reduce leakage currents, further leading to reduced real estate needs Having the gate traverse two or more sides of the fin or channel results in much quicker off current than prior bulk CMOS or planar devices. Further, the current characteristics of p-doped MuGFET devices may exhibit similar or higher gain than corresponding n-doped MuGFET devices. This may reduce the potential effects of degradation of devices over time.

The use of MuGFET transistors may also provide a better subthreshold slope that is steeper than bulk CMOS devices, so the device switches off more quickly. Since the channels are formed by the use narrow fins, improved matching of the devices is significantly easier than in bulk or planar CMOS devices, allowing better control of their current characteristics.

Figure 3:
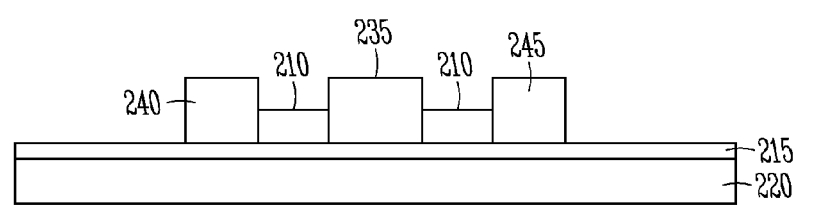
FIG. 3 illustrates a cross-sectional view of a MuGFET device shown in FIG. 2, according to some embodiments of the invention.

FIG. 3 illustrates a cross-sectional view of a MuGFET device 200 shown in FIG. 2, according to some embodiments of the invention. In some embodiments, the substrate is made of silicon. In other embodiments, the substrate can be made of other semiconductor materials, like germanium, and gallium arsenate. In an embodiment, the substrate can be of a BOX (Buried Oxide) structure. In another embodiment, the substrate can be of a SOI (Silicon On Insulator) structure.

Figure 4:
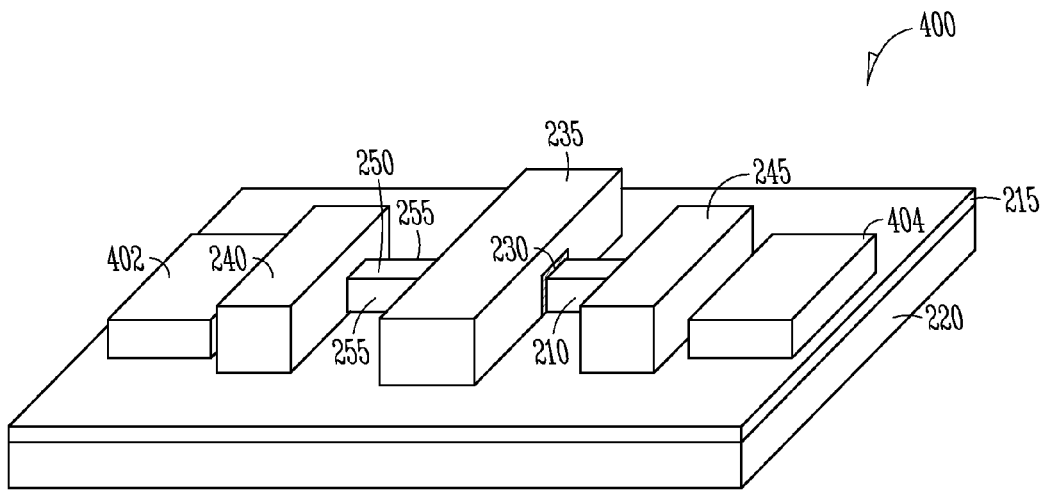
FIG. 4 illustrates a perspective view of a system providing the semiconductor circuit shown in FIG. 1A or FIG. 1B, according to some embodiments of the invention.

FIG. 4 illustrates a perspective view of a system 400 providing the semiconductor circuit shown in FIG. 1A or FIG. 1B, according to some embodiments of the invention. System 400 includes a first circuit 402, a MuGFET device 200 (shown in FIG. 1), and a second circuit 404. In some embodiments, circuit 402 and circuit 404 are electrically coupled to source/drain regions 240 and 245, respectively using coupling networks 602 and 604 (shown in FIG. 5B) that may be disposed on the substrate.

In operation, when the gate region 235 of MuGFET 200 is provided with an input signal (for eg., a switch turn-on signal), the conducting channel, namely fin 210 provides a signal path between the first semiconductor circuit 402 and the second semiconductor circuit 404. Similarly, when the input signal is terminated, the conducting channel (fin 210) will stop conducting and consequently the signal path between the semiconductor circuits 402 and 404 will be broken.

In some embodiments, the system shown in FIG. 4 may be used in switched capacitor and mixed signal applications. In some embodiments, semiconductor circuit 402 includes a voltage source and semiconductor circuit 404 includes a capacitor. In some embodiments, semiconductor circuit 402 includes a MuGFET device overlying the substrate 220. In some embodiments, semiconductor circuit 402 includes a CMOS device overlying the substrate 220. In some embodiments, semiconductor circuit 404 includes a MuGFET device formed above the substrate 220.

Figure 5A:
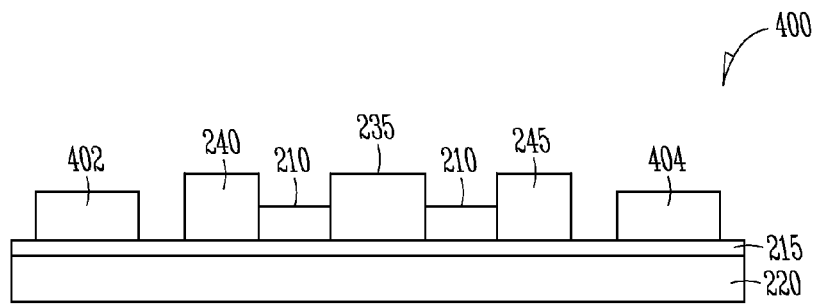
FIG. 5A illustrates a cross-sectional view of the system shown in FIG. 4, according to some embodiments of the invention.
Figure 5B:
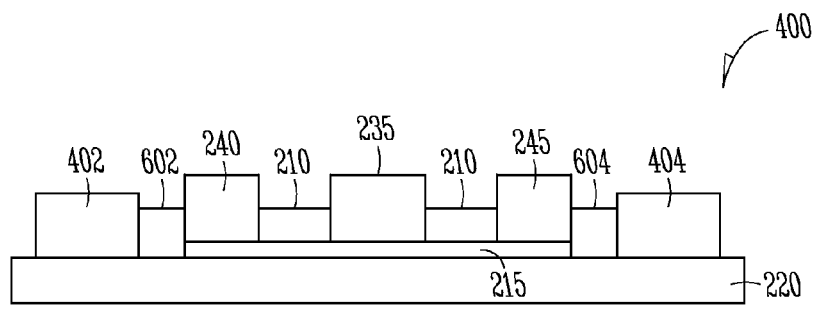
FIG. 5B illustrates a cross-sectional view of a MuGFET device according to one example embodiment of the invention.

FIG. 5 illustrates a cross-sectional view of system 400 shown in FIG. 4, according to some embodiments of the invention.

Figure 6:
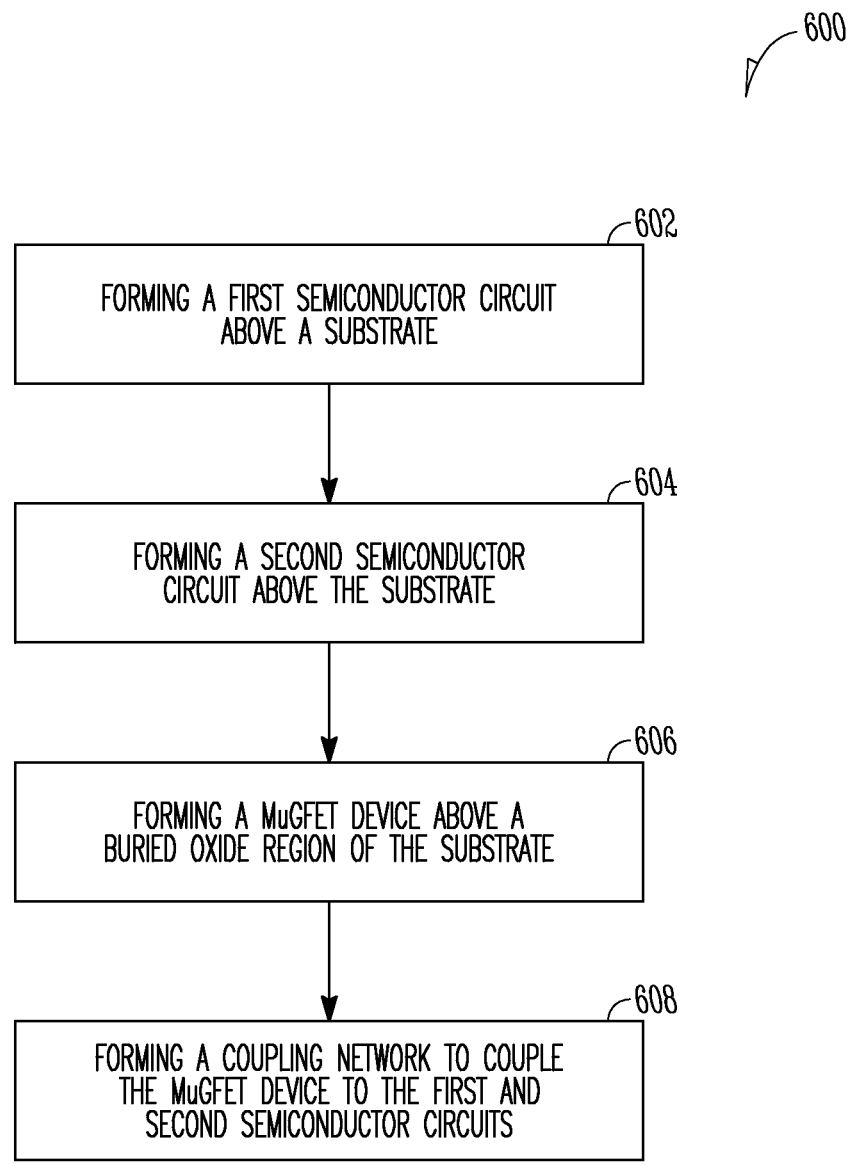
FIG. 6 is a flow chart of some embodiments of a method of forming system that provides a signal path between a two semiconductor circuits in response to an input signal.

FIG. 6 is a flow chart of some embodiments of a method 600 of forming system 400 that provides a signal path between a two semiconductor circuits in response to an input signal. For some embodiments, the process includes forming a first semiconductor circuit above a substrate, at 602. At 604, the process includes forming a second semiconductor circuit above the substrate. At 606, the process includes forming a MuGFET device above buried oxide region of a substrate. At 608, the process includes forming a coupling network to electrically couple the MuGFET device to the first and second semiconductor circuits.

In some embodiments, forming the first semiconductor circuit at 602 comprises forming a further MuGFET device above buried oxide region of a substrate. In some embodiments, forming the first semiconductor circuit at 602 includes forming a coupling network provided to electrically couple the first semiconductor circuit to a first source of reference potential. In some embodiments, forming the second semiconductor circuit at 604 includes forming a coupling network provided to electrically couple the second semiconductor circuit to a second source of reference potential.

In some embodiments, at least one of the electronic circuit blocks fabricated according to the method described above includes at least one of a planar CMOS FET, a fin FET containing two conducting planes (MOSFET channels) and a multi-gate FET containing 3, 4 or 5 conducting planes.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including", but not limited to . . . ."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. Apparatus, comprising:
a semiconductor substrate including a first area and a second area on a same surface thereof, the first area covered by an insulating layer deposited on a portion of the same surface and the second area exposed from that insulating layer;
a first semiconductor circuit and a second semiconductor circuit overlying the semiconductor substrate, the first and second semiconductor circuits formed on the same surface in the second area; and
at least one MuGFET device formed on the insulating layer in the first area such that a fin, a source region, and a drain region of the at least one MuGFET device contact the insulating layer, the source region connected to the first semiconductor circuit and the drain region connected to the second semiconductor circuit, the at least one MuGFET device configured to provide a signal path between the first semiconductor circuit and the second semiconductor circuit in response to an input signal at a gate of the at least one MuGFET device.

2. The apparatus of claim 1, wherein the at least one MuGFET device is configured to operate as a resistive element controlled by the input signal.

3. The apparatus of claim 1, wherein the at least one MuGFET device is configured to operate as a switch.

4. The apparatus of claim 1, wherein the first semiconductor circuit comprises a MuGFET device.

5. The apparatus of claim 1, wherein the first semiconductor circuit comprises a CMOS device.

6. The apparatus of claim 1, wherein the second semiconductor circuit comprises a MuGFET device formed above the substrate.

7. The apparatus of claim 1, wherein the second semiconductor circuit comprises a capacitor.

8. The apparatus of claim 1, wherein the substrate comprises silicon on insulator (SOI).

9. The apparatus of claim 1, wherein the second area comprises a contact region not insulated by the insulating layer.

10. The apparatus of claim 1, wherein the input signal is received at a gate of the at least one MuGFET device.

11. The apparatus of claim 1, wherein the at least one MuGFET device is configured to break the signal path upon termination of the input signal.

12. The apparatus of claim 1, wherein the input signal comprises a signal configured to control resistance in the signal path.

13. The apparatus of claim 1, wherein a gate dielectric is formed between the fin and the gate of the at least one MuGFET device.

14. The apparatus of claim 1, wherein a gate dielectric is formed over the top and on the sides of the fin.

15. The apparatus of claim 1, wherein the first semiconductor circuit includes a voltage source.

16. The apparatus of claim 1, wherein the first semiconductor circuit is coupled to a first source of reference potential and the second semiconductor circuit is coupled to a second source of reference potential different from the first source of reference potential.

17. The apparatus of claim 1, wherein the gate of the at least one MuGFET device is formed on the insulating layer.

18. The apparatus of claim 1, wherein the source region is connected to the first semiconductor circuit via a first coupling element and wherein the drain region is connected to the second semiconductor circuit via a second coupling element, each of the first and second coupling element formed on the same surface in the second area.

19. The apparatus of claim 1, wherein the at least one MuGFET device comprises a first MuGFET device and a second MuGFET device.

20. The apparatus of claim 19, wherein the first MuGFET device comprises an n-type channel and the second MuGFET device comprises a p-type channel.

21. The apparatus of claim 19, wherein the input signal comprises a first control signal and a second control signal, wherein the first control signal is received at a gate of the first MuGFET device and the second control signal is received at a gate of the second MuGFET device.

22. The apparatus of claim 21, wherein the signal path is established upon receiving the first control signal and the second control signal.

23. A method, comprising:
providing a semiconductor substrate including a first area and a second area on a same surface thereof, the first area covered by an insulating layer deposited on a portion of the same surface and the second area exposed from that insulating layer;
forming a first semiconductor circuit and a second semiconductor circuit above the semiconductor substrate such that the first and second semiconductor circuits formed on the same surface in the second area; and
forming at least one MuGFET device on the insulating layer in the first area such that a fin, a source region, and a drain region of the at least one MuGFET device contact the insulating layer, the source region connected to the first semiconductor circuit and the drain region connected to the second semiconductor circuit, the at least one MuGFET device configured to provide a signal path between the first semiconductor circuit and the second semiconductor circuit in response to an input signal at a gate of the at least one MuGFET device.

24. The method of claim 23, wherein the first semiconductor circuit comprises a CMOS device.

25. The method of claim 23, wherein the second semiconductor circuit comprises a MuGFET device.

26. The method of claim 23, wherein the second semiconductor circuit comprises a capacitor.

27. The method of claim 23, wherein the substrate comprises silicon on insulator (SOI).

28. The method of claim 23, wherein the second area comprises a contact region not insulated by the insulating layer.

29. The method of claim 23, wherein the first semiconductor circuit comprises a MuGFET device.

30. The method of claim 29, wherein the at least one MuGFET device includes a reference terminal.

31. An apparatus, comprising:
a semiconductor substrate including a first area and a second area on a same surface thereof, the first area covered by an insulating layer deposited on a portion of the same surface and the second area exposed from that insulating layer;
a first semiconductor circuit and a second semiconductor circuit formed above the semiconductor substrate such that the first and second semiconductor circuits formed on the same surface in the second area; and
at least one MuGFET device formed on the insulating layer in the first area such that a fin, a source region, and a drain region of the at least one MuGFET device contact the insulating layer, the source region connected to the first semiconductor circuit and the drain region connected to the second semiconductor circuit, the at least one MuGFET device including a plurality of fins and configured to provide a signal path between the first semiconductor circuit and the second semiconductor circuit in response to an input signal at a gate of the at least one MuGFET device.

32. The apparatus of claim 31, wherein the second area comprises a contact region not insulated by the insulating layer.

33. The apparatus of claim 31, wherein the substrate comprises silicon on insulator (SOI).

34. A system, comprising:
a first semiconductor circuit and a semiconductor second circuit overlying a semiconductor substrate including a first area and a second area on a same surface thereof, the first area covered by an insulating layer deposited on a portion of the same surface and the second area exposed from that insulating layer, the first and second semiconductor circuits formed on the same surface in the second area; and
a switching device electrically coupled to the first circuit and the second circuit, the switching device including at least one MuGFET device formed on the insulating layer in the first area such that a fin, a gate, a source region, and a drain region of the at least one MuGFET contact the insulating layer, the source region connected to the first semiconductor circuit and the drain region connected to the second semiconductor circuit, the switching device configured to provide a signal path between the first semiconductor circuit and the second semiconductor circuit in response to an input signal at the gate.

35. The system of claim 34, wherein the second area comprises a contact region not insulated by the insulating layer.

36. The system of claim 34, wherein the substrate comprises silicon on insulator (SOI).

* * * * *